(12) United States Patent
Nagatomo

(10) Patent No.: US 10,490,978 B2
(45) Date of Patent: Nov. 26, 2019

(54) SURFACE EMITTING LASER, INFORMATION OBTAINING APPARATUS, AND IMAGING APPARATUS

(71) Applicant: CANON KABUSHIKI KAISHA, Tokyo (JP)

(72) Inventor: Yasuhiro Nagatomo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/567,939

(22) PCT Filed: Apr. 21, 2016

(86) PCT No.: PCT/JP2016/002148
§ 371 (c)(1),
(2) Date: Oct. 19, 2017

(87) PCT Pub. No.: WO2016/174857
PCT Pub. Date: Nov. 3, 2016

(65) Prior Publication Data
US 2018/0123319 A1    May 3, 2018

(30) Foreign Application Priority Data
Apr. 30, 2015 (JP) ................. 2015-093535

(51) Int. Cl.
*H01S 5/183* (2006.01)
*G01B 9/02* (2006.01)
(Continued)

(52) U.S. Cl.
CPC ...... *H01S 5/18361* (2013.01); *G01B 9/02015* (2013.01); *G01B 9/02091* (2013.01);
(Continued)

(58) Field of Classification Search
CPC .. H01S 5/18361; H01S 5/187; H01S 5/18316; H01S 5/068; H01S 5/18366;
(Continued)

(56) References Cited

U.S. PATENT DOCUMENTS

| 4,825,262 A | 4/1989 | Mallinson |
| 5,771,253 A * | 6/1998 | Chang-Hasnain ... G02B 26/001 372/20 |

(Continued)

FOREIGN PATENT DOCUMENTS

| JP | 2002-500446 A | 1/2002 |
| JP | 2002-319740 A | 10/2002 |

(Continued)

OTHER PUBLICATIONS

International Search Report and Written Opinion for PCT/JP2015/006108 and notification of transmittal of the ISR/WO, dated Apr. 4, 2016.

(Continued)

*Primary Examiner* — Xinning(Tom) Niu
(74) *Attorney, Agent, or Firm* — Canon U.S.A., Inc. I.P. Division

(57) ABSTRACT

The present invention provides a surface emitting laser the wavelength-tunable band of which is wide. The wavelength-tunable surface emitting laser includes a first reflector (101), an active layer (103) disposed on the first reflector (101), a beam portion (110) disposed over the active layer (103) with an air gap therebetween, and a second reflector (120) disposed on the beam portion (110). The second reflector (120) has a distributed Bragg reflector consisting of a stack of dielectric layers. The beam portion (110) has a distributed Bragg reflector consisting of a stack of conductive semiconductor layers.

13 Claims, 9 Drawing Sheets

(51) Int. Cl.
*H01S 5/068* (2006.01)
*H01S 5/187* (2006.01)

(52) U.S. Cl.
CPC .............. *H01S 5/068* (2013.01); *H01S 5/187* (2013.01); *H01S 5/18316* (2013.01); *H01S 5/18366* (2013.01); *H01S 5/18369* (2013.01); *H01S 5/18377* (2013.01)

(58) Field of Classification Search
CPC ............. H01S 5/18377; H01S 5/18369; G01B 9/02015; G01B 9/02091
See application file for complete search history.

(56) References Cited

U.S. PATENT DOCUMENTS

| | | | |
|---|---|---|---|
| 6,538,748 | B1 | 3/2003 | Tucker et al. |
| 8,059,690 | B2 | 11/2011 | Chang-Hasnain et al. |
| 8,189,643 | B2 | 5/2012 | Chang-Hasnain et al. |
| 8,989,230 | B2 | 3/2015 | Dummer et al. |
| 2002/0061042 | A1 | 5/2002 | Wang et al. |
| 2002/0131458 | A1* | 9/2002 | Sirbu ............ B82Y 20/00 372/20 |
| 2002/0135909 | A1 | 9/2002 | Rankin et al. |
| 2003/0012231 | A1 | 1/2003 | Tayebati et al. |
| 2004/0076198 | A1 | 4/2004 | Spoonhower et al. |
| 2005/0074197 | A1 | 4/2005 | Tada et al. |
| 2008/0159468 | A1 | 7/2008 | Chong |
| 2009/0303487 | A1 | 12/2009 | Bond et al. |
| 2012/0189184 | A1* | 7/2012 | Matsumoto ........... A61B 3/102 382/131 |
| 2014/0268169 | A1 | 9/2014 | Jayaraman et al. |
| 2015/0010031 | A1 | 1/2015 | Makino et al. |
| 2016/0164254 | A1 | 6/2016 | Inao |
| 2016/0301189 | A1 | 10/2016 | Cable et al. |

FOREIGN PATENT DOCUMENTS

| | | |
|---|---|---|
| JP | 2004-140371 A | 5/2004 |
| JP | 2004-281733 A | 10/2004 |
| JP | 2010-62426 A | 3/2010 |
| WO | 2016/103604 A1 | 6/2016 |

OTHER PUBLICATIONS

Yano, et al., "Wavelength Modulation Over 500 kHz of Micromechanically Tunable InP-Based VCSELs With Si-MEMS Technology", IEEE Journal of Selected Topics in Quantum Electronics, May/Jun. 2009, vol. 15, No. 3, pp. 528-534.

Wang, et al., "Half-symmetric cavity microelectromechanically tunable vertical cavity surface emitting lasers with single spatial mode operating near 950 nm", Applied Physics Letters, American Institute of Physics, Aug. 16, 1999, vol. 75, No. 7, pp. 897-898.

Huber, et al., "Reducing Brownian Motion in an Electrostatically Tunable MEMS Laser", Journal of Microelectromechanical Systems, Oct. 2004, vol. 13, No. 5, pp. 732-736.

International Search Report and Written Opinion for PCT/JP2016/002148 and notification of transmittal of the ISR/WO, dated Jul. 28, 2016.

Garrett D. Cole, et al., "Short-wavelength MEMS-tunable VCSELs", Optics Express, Sep. 29, 2008, vol. 16, No. 20, pp. 16093-16103.

* cited by examiner

SURFACE EMITTING LASER, INFORMATION OBTAINING APPARATUS, AND IMAGING APPARATUS

TECHNICAL FIELD

The present invention relates to a surface emitting laser, an information obtaining apparatus, and an imaging apparatus.

BACKGROUND ART

Recently, research and development have been actively performed on a wavelength-tunable lasers the oscillation wavelength of which is tunable since application to various fields such as communication, sensing, imaging, and so forth can be expected. As a wavelength-tunable laser, a configuration in which one of a pair of reflectors of a vertical cavity surface emitting laser (hereinafter referred to as VCSEL) is moved, has been developed. Specifically, by mechanically moving one of a pair of reflectors (a movable reflector) by micro electro mechanical systems (hereinafter referred to as MEMS) technology, the resonator length is fluctuated, and the oscillation wavelength of the VCSEL is changed. Such a VCSEL will hereinafter be referred to as a MEMS-VCSEL.

As a movable reflector, a distributed Bragg reflector (hereinafter referred to as DBR) made of dielectric can be used. NPL 1 discloses a MEMS-VCSEL in which a dielectric DBR is formed on the top of a beam portion, and wavelength is tuned by driving the beam portion.

CITATION LIST

Non Patent Literature

NPL 1: Garrett D. Cole et al. "Short-Wavelength MEMS-tunable VCSELs," OPTICS EXPRESS 29 Sep. 2008 Vol. 16 No. 20, pp. 16093-16103

SUMMARY OF INVENTION

Technical Problem

As shown in FIG. 4 of NPL 1, a dielectric DBR has a high reflectance in a wide wavelength band, but, in a reflectance spectrum of this dielectric DBR, there exists a region called a dip where the reflectance largely decreases. In a wavelength-tunable VCSEL, at a wavelength corresponding to this dip, the oscillation threshold increases, and oscillation becomes difficult. Therefore, the wavelength-tunable band cannot be widened.

The present invention provides a surface emitting laser the wavelength-tunable band of which is wide.

Solution to Problem

In an aspect of the present invention, a wavelength-tunable surface emitting laser includes a first reflector, an active layer disposed on the first reflector, a beam portion disposed over the active layer with an air gap therebetween, and a second reflector disposed on the beam portion. The second reflector has a distributed Bragg reflector consisting of a stack of dielectric layers. The beam portion has a distributed Bragg reflector consisting of a stack of conductive semiconductor layers.

Further features of the present invention will become apparent from the following description of exemplary embodiments with reference to the attached drawings.

Advantageous Effects of Invention

The present invention can provide a surface emitting laser the wavelength-tunable band of which is wide.

DESCRIPTION OF EMBODIMENTS

Figure 10A:
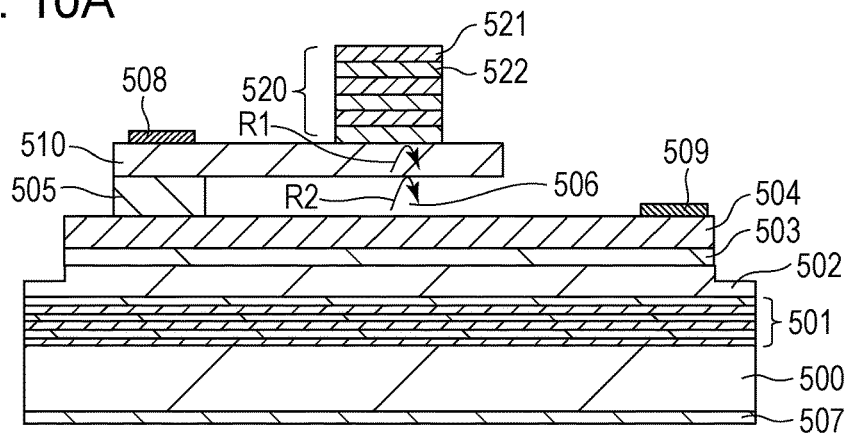
FIG. 10A shows a MEMS-VCSEL of a comparative example.

First, the above problem will be described in detail. FIG. 10A is a sectional schematic view showing a surface emitting laser of a comparative example. This vertical cavity surface emitting laser (VCSEL) has, on the top surface of a substrate 500, a first reflector 501, a lower spacer layer 502, an active layer 503, an upper spacer layer 504, a support layer 505, a beam portion 510, and a second reflector 520. The second reflector 520 is a dielectric multilayer film (dielectric DBR) formed on the top surface of the beam portion 510. Specifically, the second reflector 520 has a configuration in which high refractive index layers 521 and low refractive index layers 522 are alternately stacked. An air gap 506 is formed between the beam portion 510 and the upper spacer layer 504. The beam portion 510 is supported by the support layer 505.

A first electrode 507 is formed on the bottom surface of the substrate 500, and a second electrode 508 is formed on the top surface of the beam portion 510. A third electrode 509 is formed on the top surface of the upper spacer layer 504. By applying a voltage between the first electrode 507 and the third electrode 509, electrons and holes are supplied to the active layer 503 and are recombined, and light is thereby generated in the active layer 503.

The beam portion 510 is formed of single crystal semiconductor, and has conductivity. By applying an AC voltage between the second electrode 508 and the third electrode 509, the beam portion 510 vibrates in the thickness direction of the active layer 503. As a result, the second reflector 520 also vibrates in the thickness direction of the active layer 503, and the resonator length of a resonator consisting of the first reflector 501 and the second reflector 520 fluctuates. Of light rays generated in the active layer 503, light rays of a specific wavelength according to the resonator length are emitted to the outside. Thus, the oscillation wavelength of the surface emitting laser can be tuned.

Figure 10B:
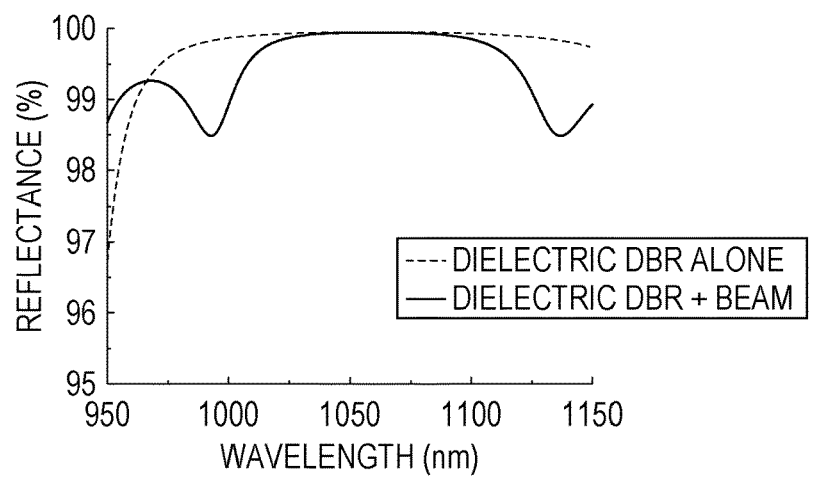
FIG. 10B shows the calculation result of the reflectance spectrum of a structure in which a beam portion and a reflector are stacked, of the MEMS-VCSEL of the comparative example.
Figure 10C:
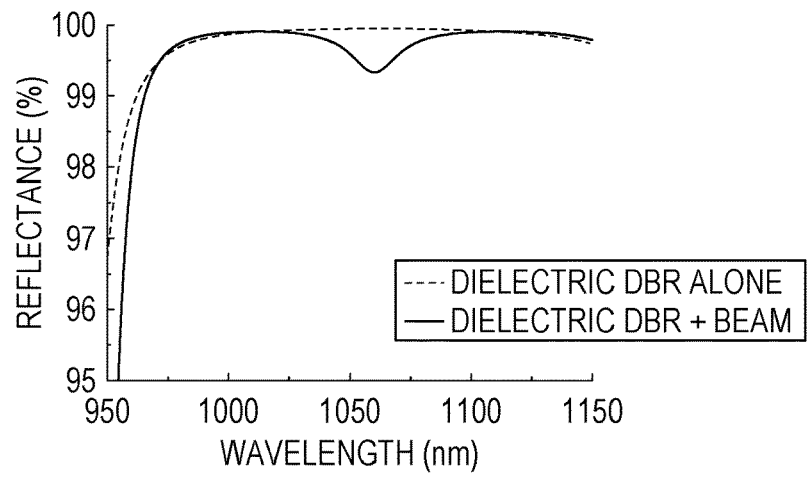
FIG. 10C shows the calculation result of the reflectance spectrum of a structure in which a beam portion and a reflector are stacked, of the MEMS-VCSEL of the comparative example.

The reflectance spectrum of a structure consisting of the beam portion 510 and the second reflector 520 is shown by solid line of FIGS. 10B and 10C. The solid line of FIG. 10B shows the calculation result in the case where the optical thickness of the beam portion 510 formed of GaAs is 2.5λ. The solid line of FIG. 10C shows the calculation result in the case where the optical thickness of the beam portion 510 formed of GaAs is 2.75λ. In both FIGS. 10B and 10C, the second reflector 520 has a configuration in which 10.5 pairs of high refractive index layers 521 formed of $Ta_2O_5$ and low refractive index layers 522 formed of $SiO_2$ alternately stacked such that the optical thickness of each layer is λ/4. Here, λ is 1060 nm, which is the center wavelength of the light emitting band of the active layer 503. The dashed line of FIGS. 10B and 10C shows the reflectance spectrum of the second reflector 520 alone without the beam portion 510.

As shown in FIGS. 10B and 10C, in the case of a structure consisting of the beam portion 510 and the second reflector 520, a dip or dips exist, which are regions where the reflectance decreases and which do not exist in the case of a configuration of the second reflector 520 alone. In FIG. 10B, two dips exist at wavelengths slightly distant from the center wavelength 1060 nm. In FIG. 10C, a dip exists at a wavelength near the center wavelength 1060 nm.

Specifically, as follows. In general, in a VCSEL, a high reflectance, for example, of 99.5% or more is necessary to generate laser oscillation. As shown by dashed line of FIGS. 10B and 10C, in a configuration of the second reflector 520 alone, the wavelength band in which the reflectance is 99.5% or more is a range of 972 nm to 1166 nm and has a wavelength width of 194 nm. In contrast, in the case of a structure in which the beam portion 510 and the second reflector 520 are stacked, when the optical thickness of the beam portion 510 is 2.5λ (=5λ/2) (solid line of FIG. 10B), the wavelength band in which the reflectance is 99.5% or more is a range of 1008 nm to 1118 nm and has a wavelength width of 110 nm. When the optical thickness of the beam portion 510 is 2.75λ (=11λ/4) (solid line of FIG. 10C), the wavelength band in which the reflectance is 99.5% or more is a range of 972 to 1053 nm and has a wavelength width of 81 nm. Thus, it can be seen that, in the case of a structure in which the beam portion 510 and the second reflector 520 are stacked, the wavelength band in which the reflectance is 99.5% or more is narrower than that in the case of the second reflector 520 alone, and the oscillatable wavelength band is narrow. As a result, in a structure in which the beam portion 510 and the second reflector 520 are stacked such as the comparative example, the wavelength-tunable range is narrow.

This is attributed to the following mechanism. That is, as shown by the arrow of FIG. 10A, reflected light R1 reflected by the second reflector 520 side surface of the beam portion 510 and reflected light R2 reflected by a surface of the beam portion 510 that is opposite to the second reflector 520 side surface, cause destructive interference at a specific wavelength. In particular, in the case where the optical thickness of the beam portion 510 is 2.75λ (=11λ/4), reflection near the center wavelength 1060 nm decreases as with an anti-reflection film.

In contrast, the present invention employs a configuration of a multilayer film having a plurality of reflecting surfaces therein. In addition, the beam portion causes some of light rays emitted from the active layer to be reflected by a reflecting surface at the interface between the beam portion and the air gap, a reflecting surface at the interface between the beam portion and the second reflector, and a plurality of reflecting surfaces in the beam portion. The beam portion causes light rays reflected by the respective reflecting surfaces of the beam portion to interfere with each other so as to reduce the above destructive interference effect. The above-described decrease of wavelength band can thereby be suppressed. In other words, the beam portion is formed of a multilayer film such that the width of a wavelength band having a reflectance of 99.5% or more in the reflectance spectrum of the second reflector is larger than that in the case where the beam portion is formed of a single layer.

When the beam portion is driven in the thickness direction of the active layer, electrostatic force, magnetic force, or the like can be used as driving force. The present invention is also applicable to a surface emitting laser that tunes the wavelength by driving a thin film provided in the air gap without driving the beam portion.

A vertical cavity surface emitting laser (VCSEL) of the present invention will be described below. First, terms used in this specification will be defined.

In this specification, when the vertical direction of a VCSEL structure is mentioned, the substrate side is referred to as bottom side, and the side opposite from the substrate is referred to as top side. In this specification, the length in the optical axis direction of a gap in a MEMS-VCSEL resonator may be referred to as air gap length. The optical axis direction means a direction parallel to the direction in which light travels in a resonator, and is a direction perpendicular to the principal surface of the substrate, in other words, the thickness direction of the active layer.

A region in which reflectance exceeds 99.5% in a reflectance spectrum of a reflector will be referred to as a reflection band. Unless otherwise defined, the center wavelength is a wavelength at the center of the reflection band, and is a wavelength intermediate between the shortest wavelength and the longest wavelength in the reflection band. In this specification, high refractive index layer of a DBR means one of the two layers forming the DBR that has a higher refractive index than that of the other layer. Similarly, low refractive index layer of a DBR means one of the two layers forming the DBR that has a lower refractive index than that of the other layer.

First Embodiment

Figure 1A:
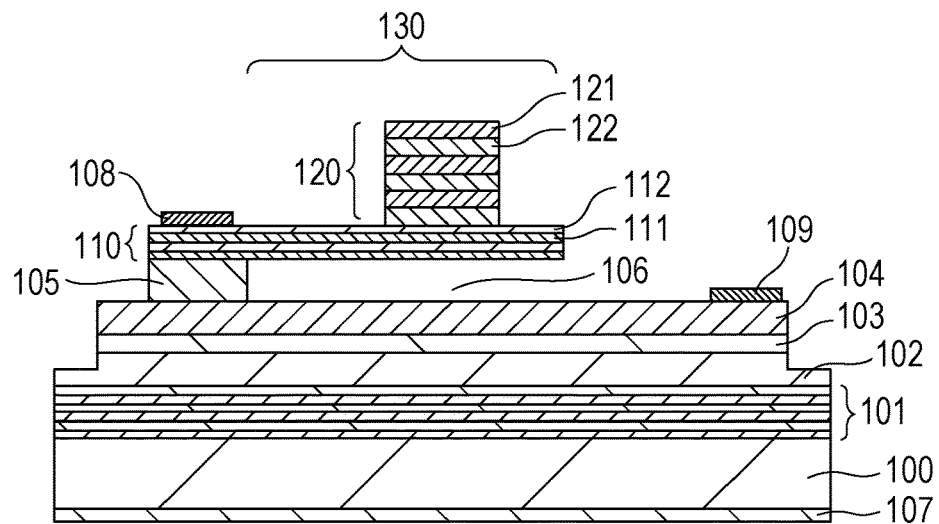
FIG. 1A is a schematic diagram showing an example of MEMS-VCSEL according to a first embodiment of the present invention.
Figure 1B:
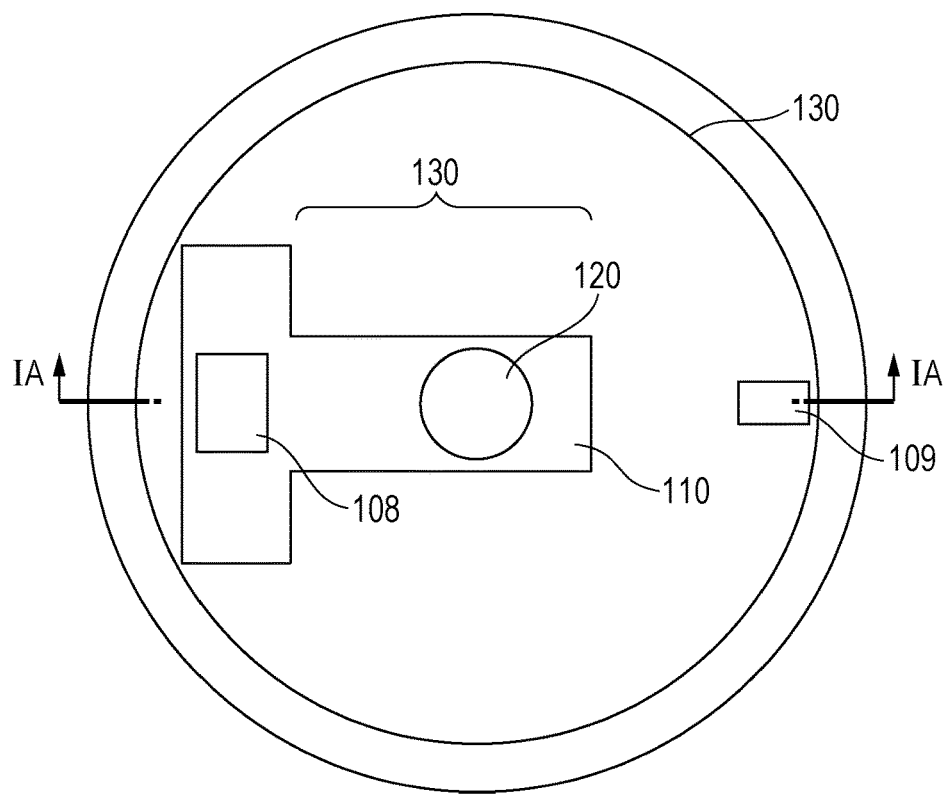
FIG. 1B is a schematic diagram showing an example of MEMS-VCSEL according to a first embodiment of the present invention.

The configuration of a MEMS-VCSEL that is an example of a wavelength-tunable surface emitting laser according to this embodiment will be described below. FIG. 1A is a sectional schematic view of the MEMS-VCSEL according to this embodiment, and FIG. 1B is a top schematic view of the MEMS-VCSEL according to this embodiment. FIG. 1A corresponds to a sectional schematic view taken along line IA-IA of FIG. 1B.

This MEMS-VCSEL has, on the top surface of a substrate 100, a first reflector 101, a lower spacer layer 102, an active layer 103, an upper spacer layer 104, a support layer 105, a beam portion 110, and a second reflector 120. The second reflector 120 is a dielectric multilayer film (dielectric DBR) formed on the top surface of the beam portion 110 and formed of a stack of dielectric layers. Specifically, the second reflector 120 has a configuration in which high refractive index layers 121 and low refractive index layers 122 are alternately stacked. An air gap 106 is formed between the beam portion 110 and the upper spacer layer 104. The beam portion 110 is supported by the support layer 105. Hereinafter, the beam portion 110 and the second reflector 120 are sometimes collectively referred to as a movable portion.

A first electrode 107 is formed on the bottom surface of the substrate 100, and a second electrode 108 is formed on the top surface of the beam portion 110. A third electrode 109 is formed on the top surface of the upper spacer layer 104. By applying a voltage between the first electrode 107 and the third electrode 109, electrons and holes are supplied to the active layer 103 and are recombined, and light is thereby generated in the active layer 103.

The beam portion 110 is formed of single crystal semiconductor, and contains a dopant so as to have conductivity. By applying an AC voltage between the second electrode 108 and the third electrode 109, the beam portion 110 vibrates in the thickness direction of the active layer 103. As a result, the second reflector 120 also vibrates in the thickness direction of the active layer 103, and the resonator length of a resonator consisting of the first reflector 101 and the second reflector 120 fluctuates. Of light rays generated in the active layer 103, light rays of a specific wavelength according to the resonator length are emitted to the outside. Thus, the oscillation wavelength of the surface emitting laser can be tuned.

FIG. 1B is a top schematic view of the MEMS-VCSEL. The third electrode 109 is provided on a part of the circumference of the upper spacer layer 104, but may be provided along the entire circumference of the upper spacer layer 104. A plurality of third electrodes 109 may be provided on the top surface of the upper spacer layer 104. A plurality of second electrodes 108 may be provided on the top surface of the beam portion 110. The second electrode 108 is preferably provided not in a region of the beam portion 110 that corresponds to the air gap 106, that is, a movable region 130, but in a region of the beam portion 110 that corresponds to the support layer 105.

Figure 2A:
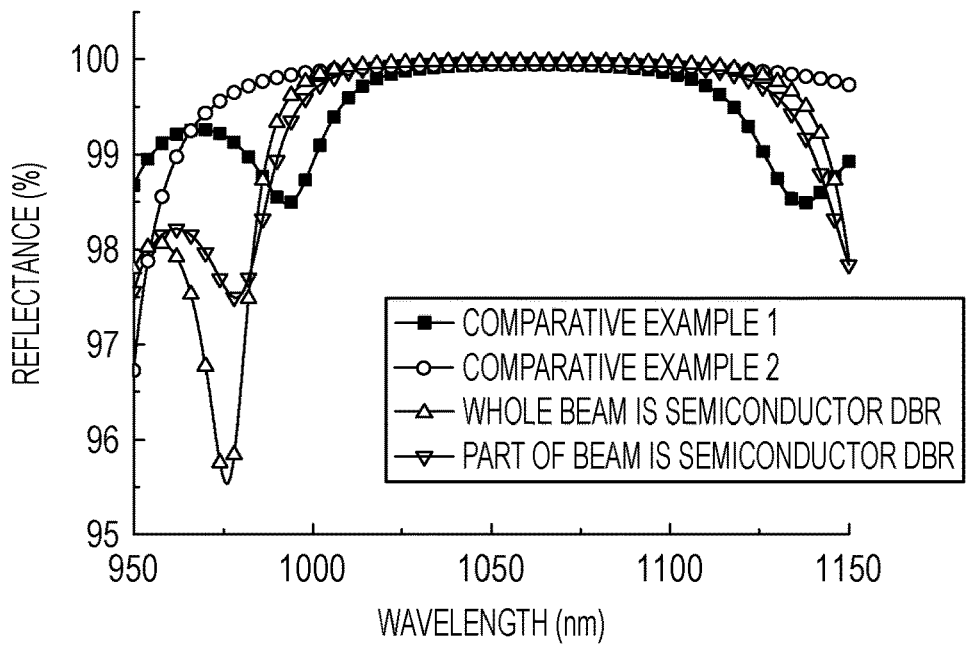
FIG. 2A shows optical characteristics of a movable portion of the first embodiment of the present invention and movable portions of comparative examples.

The beam portion 110 of this embodiment has a multilayer film formed of a stack of semiconductor layers (a semiconductor DBR). Owing to this configuration, light reflection occurs not only at the upper and lower ends of the beam portion 110 but also at a plurality of places in the beam portion. The effect of a Fabry-Perot resonator formed by reflecting surfaces at the upper and lower ends of the beam portion 110 is weakened by the interference effect of the reflecting surface at the upper end, the reflecting surface at the lower end, and a plurality of reflecting surfaces in the beam portion. As a result, the reflectance spectrum approaches that in the case where the beam portion 110 is not provided, and the reflecting band of the movable portion is wide compared to the conventional example. The reflectance spectrum of the movable portion of this embodiment is shown in FIG. 2A. The reflectance spectrum is the result of calculation when the material constitutions of the beam portion 110 and the second reflector 120 are set as follows.

The dielectric DBR forming the second reflector 120 is formed by alternately stacking 10.5 pairs of high refractive index layers 121 and low refractive index layers 122. The high refractive index layers 121 are formed of $Ta_2O_5$, and the low refractive index layers 122 are formed of $SiO_2$. The optical thickness of each layer is designed so as to be $\lambda/4$ (=265 nm), where $\lambda$ is 1060 nm.

The beam portion 110 has a semiconductor DBR in which 5 pairs of high refractive index layers 111 and low refractive index layers 112 are alternately stacked. The high refractive index layers 111 are formed of GaAs, and the low refractive index layers 112 are formed of $Al_{0.7}Ga_{0.3}As$. The optical thickness of each layer is designed so as to be $\lambda/4$ (=265 nm), where $\lambda$ is 1060 nm. The optical thickness of the whole beam portion 110 is $2.5\lambda$.

Comparative Example 1 shown in FIG. 2A is the reflectance spectrum of a configuration such that the beam portion 110 of the movable portion of this embodiment is replaced with a GaAs single layer having the same optical thickness, and corresponds to the reflectance spectrum of the movable portion of the comparative example of FIG. 10A. Comparative Example 2 is the reflectance spectrum of a configuration from which the beam portion 110 is removed and that is composed only of the second reflector 120. The reflectance spectrum of a configuration in which the whole beam portion 110 is a semiconductor DBR, and the reflectance spectrum of a configuration in which a part of the beam portion 110 on the side in contact with the second reflector 120 is a semiconductor DBR (1.5λ thick) formed of 3 pairs of layers, and the rest is a uniform GaAs single layer having an optical thickness of 1λ, are also shown.

The reflection band of the configuration of Comparative Example 1 was 110 nm, and the reflection band of the configuration of Comparative Example 2 was 194 nm. The reflection band of the configuration in which the whole beam portion 110 is a semiconductor DBR was 146 nm, and the reflection band of the configuration in which a part of the beam portion 110 is a semiconductor DBR was 130 nm.

As described above, the reflection band of the movable portion having the beam portion 110 having a semiconductor DBR has a wavelength width wider than that of the reflection band of the movable portion of Comparative Example 1. That is, by forming at least a part of the beam portion 110 of a semiconductor DBR, the decrease of reflection band can be suppressed.

Compared to the configuration to which the present invention is applied, Comparative Example 2 shows a wider reflection band. That is, even when the present invention is applied, the decrease of reflection band due to the influence of the semiconductor beam portion cannot be completely suppressed. When considering only optical characteristics, the configuration of Comparative Example 2 is superior. However, when applying this movable portion to a MEMS-VCSEL, the MEMS-VCSEL is difficult to manufacture. For this reason, the present invention is the most excellent from the viewpoint of productivity and wide reflection band. Conventional methods such as photolithography and sacrifice layer etching can be applied to the present invention.

Figure 2B:
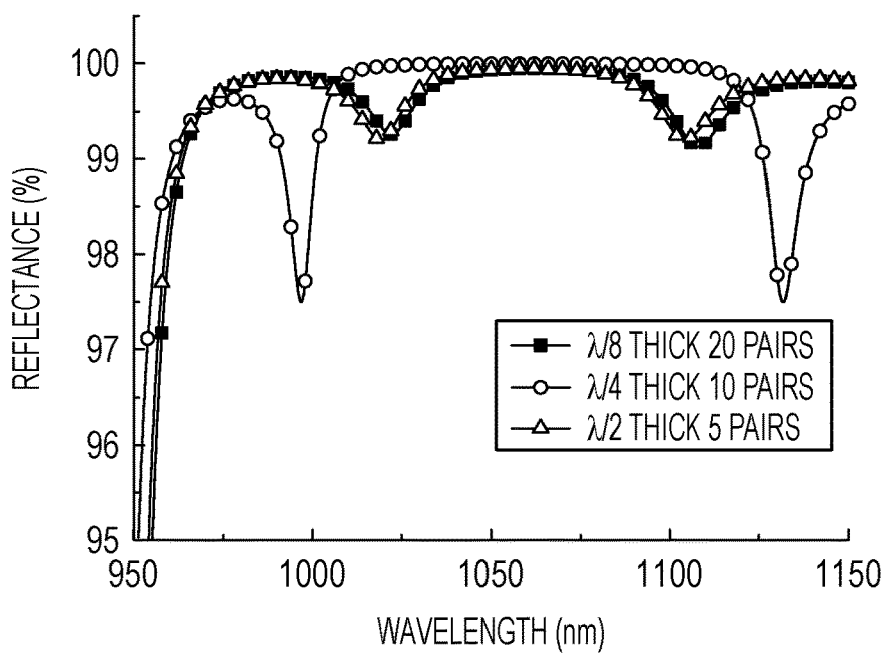
FIG. 2B shows optical characteristics of a movable portion of the first embodiment of the present invention and movable portions of comparative examples.

As described above, in order to obtain the advantageous effect of the present invention, it is important to cause light reflection at places other than the upper end and the lower end of the beam portion. However, that is not enough. It is important that reflections from different places strengthen each other as in a DBR. FIG. 2B shows the result of calculation of the reflectance spectrum of a movable portion in which a second reflector 120 formed of a dielectric DBR is stacked on the top surface of a beam portion formed of a multilayer film in which high refractive index layers and low refractive index layers are alternately stacked. The configuration of the second reflector 120 is the same as that of the calculation of FIG. 2A. The high refractive index layers of the beam portion are GaAs layers, and the low refractive index layers are $Al_{0.7}Ga_{0.3}As$ layers.

Calculation was performed with regard to three types of structures of beam portion: a stack of 5 pairs of layers each having an optical thickness of λ/2, a stack of 10 pairs of layers each having an optical thickness of λ/4, and a stack of 20 pairs of layers each having an optical thickness of λ/8, where λ is a wavelength of 1060 nm, and comparison was made. Of these, the configuration in which the optical thickness of each layer is λ/4 corresponds to a semiconductor DBR. In every configuration, the optical thickness of the whole beam portion is 5.0λ.

As shown in FIG. 2B, the reflection band of the configuration in which the optical thickness of each layer is λ/2 is 73 nm. The reflection band of the configuration in which the optical thickness of each layer is λ/4 is 120 nm. The reflection band of the configuration in which the optical thickness of each layer is λ/8 is 72 nm. The above results show that when the optical thickness of each layer is λ/4, that is, a semiconductor DBR is formed, the advantageous effect of the present invention can be obtained.

It is generally known that when, in a multilayer film such as a DBR, a layer is replaced with a layer different in optical thickness by λ/2, substantially the same optical performance is obtained. In a configuration to which the present invention is applied, some or all of the layers of the semiconductor DBR forming the beam portion may have an optical thickness of λ/4 plus an integral multiple of λ/2.

Figure 3A:
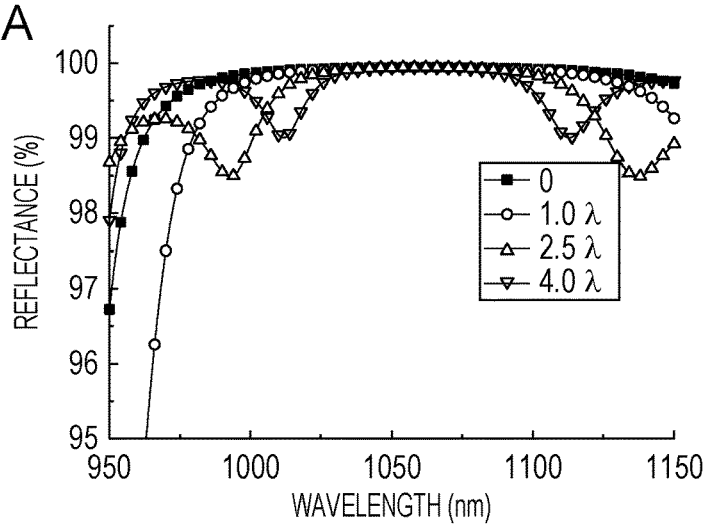
FIG. 3A shows the relationship between the thickness of the semiconductor beam portion and the reflectance spectrum.

Next, the relationship between the thickness of the beam portion and the reflectance will be described with reference to FIGS. 3A to 3B. FIG. 3A shows the change of reflectance spectrum in the case where the thickness of the beam portion of a configuration corresponding to Comparative Example 1 described above is changed. Specifically, calculation results of reflectance spectrum in the cases where the thickness of the beam portion is 0, 1.0λ, 2.5λ, and 4.0λ are shown.

Figure 3B:
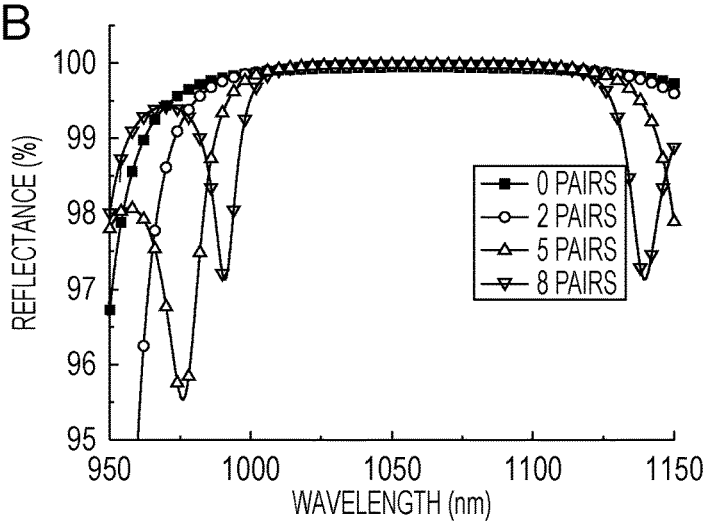
FIG. 3B shows the relationship between the thickness of the semiconductor beam portion and the reflectance spectrum.

FIG. 3B shows the change of reflectance spectrum in the case where the thickness of a beam portion 110 composed only of a semiconductor DBR having a configuration to which the present invention is applied is changed. Specifically, calculation results of reflectance spectrum in the cases where the number of pairs of layers forming a semiconductor DBR is 0 (optical thickness 0), 2 (optical thickness 1.0λ), 5 (optical thickness 2.5λ), and 8 (optical thickness 4.0λ) are shown. The configuration in which the number of pairs of layers forming a semiconductor DBR is 5 is the same as the configuration in which the whole beam portion 110 is a semiconductor DBR used in the calculation of FIG. 2A.

From FIG. 3A, in the movable portion corresponding to Conventional Example 1, the reflection band narrows as the thickness of the beam portion increases. In FIG. 3B, the reflection band narrows as the thickness of the beam portion increases, but the degree of narrowing is gradual compared to FIG. 3A.

The reason why the reflection band narrows as the thickness of the beam portion increases is as follows. When the thickness of the beam portion increases, the resonator length of the above-described Fabry-Perot resonator formed by the upper and lower ends of the beam portion increases. The mode spacing of this resonator is thereby narrowed. The two dips shown in FIG. 3A correspond to different modes in which destructive interference effect is caused by this resonator, and the mode spacing corresponds to the spacing between the dips. Therefore, an increase in thickness of the beam portion causes an increase in Fabry-Perot resonator length, and narrows the spacing between modes in which destructive interference effect occurs. Accordingly, the spacing between dips is also narrowed.

Figure 3C:
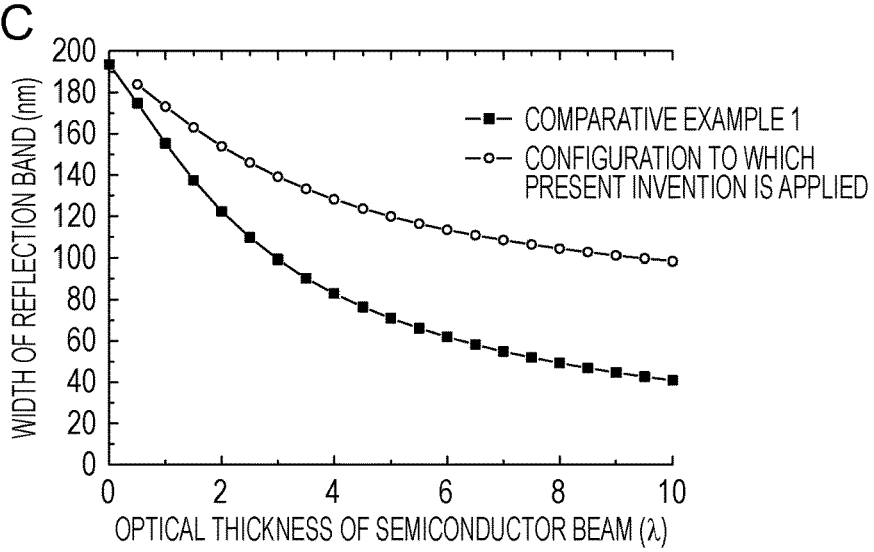
FIG. 3C shows the relationship between the thickness of the semiconductor beam portion and the reflectance spectrum.

The same calculation as FIG. 3A and FIG. 3B was performed, and reflection bands were calculated from the obtained reflectance spectra and plotted in FIG. 3C. The vertical axis shows the width of the reflection band, and the horizontal axis shows the optical thickness of the beam portion. Calculation was performed while changing the optical thickness of the beam portion in increments of λ/2, where λ is a wavelength of 1060 nm.

When the beam portion is thin, whether the beam portion is a single layer or a semiconductor DBR, the difference in the reflection band width between the two is not large. However, as the beam portion thickens, the difference in the reflection band width between the two increases, and the advantageous effect of the present invention increases.

Hence, the advantageous effect of the present invention is significant when the beam portion has a certain or more thickness from the viewpoint of mechanical characteristics (mechanical strength and resonance frequency). Specifically, when increasing the mechanical strength, the optical thickness of the beam portion is preferably equal to or greater than the center wavelength of the reflection band. In that case, the advantageous effect of the application of the present invention is significant.

A semiconductor DBR is formed by alternately stacking high refractive index layers and low refractive index layers. Whether the outermost layer (the layer closest to the active layer 103) of the semiconductor DBR is a high refractive index layer or a low refractive index layer has a large influence on reflection characteristics. In general, when the outermost layer is a high refractive index layer, high reflectance can be obtained.

Figure 4A:
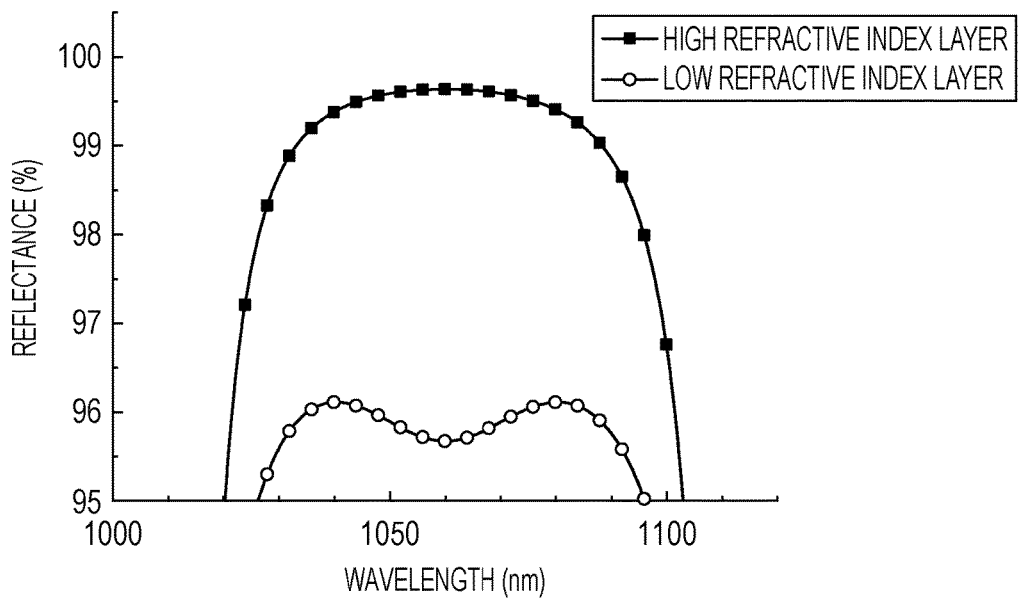
FIG. 4A shows the relationship between the configuration of the outermost layer of a movable minor and the reflectance spectrum.

FIG. 4A shows reflectance spectra of a semiconductor DBR alone in the case where the outermost layer (the layer closest to the active layer 103) on the light incident side is a high refractive index layer, and in the case where the outermost layer is a low refractive index layer. The high refractive index layers are formed of GaAs, and the low refractive index layers are formed of $Al_{0.7}Ga_{0.3}As$. The number of stacked layers is 20 pairs (in the case where the incident side outermost layer is a low refractive index layer), and 20.5 pairs (in the case where the incident side outermost layer is a high refractive index layer). In both cases, the outermost layer on the exit side is a high refractive index layer.

When the incident side outermost layer is a high refractive index layer, a band in which the reflectance exceeds 99.5% is obtained. When the incident side outermost layer is a low refractive index layer, the reflectance is at most about 96%. Thus, when using a semiconductor DBR alone as a reflector, the incident side outermost layer is preferably a high refractive index layer.

Figure 4B:
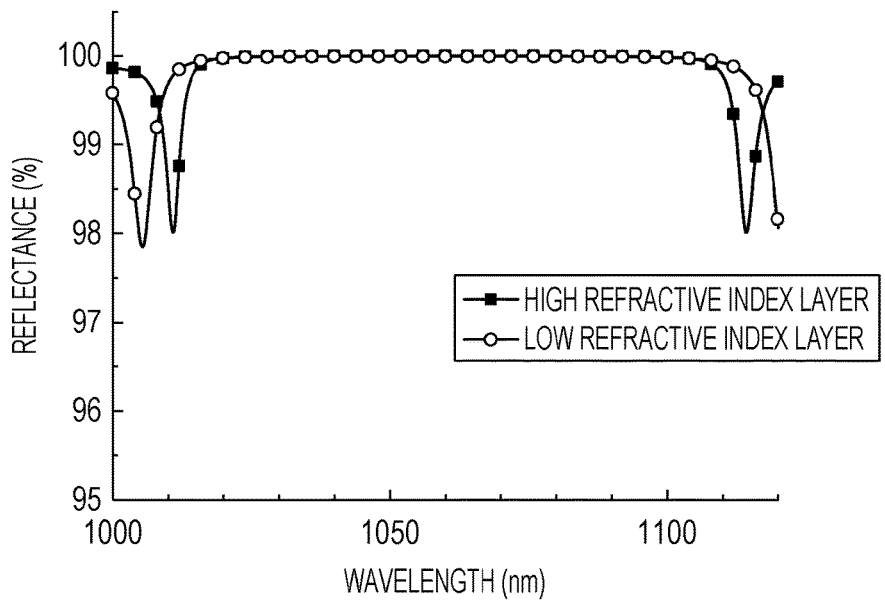
FIG. 4B shows the relationship between the configuration of the outermost layer of a movable minor and the reflectance spectrum.

FIG. 4B shows reflectance spectra of movable portions such that a dielectric DBR is stacked on the exit side of the semiconductor DBRs used in the calculation of FIG. 4A. The configuration of the dielectric DBR is assumed to be such that 10.5 pairs of low refractive index layers formed of $SiO_2$ and high refractive index layers formed of $Ta_2O_5$ are stacked.

As shown in FIG. 4B, when the incident-side outermost layer is a low refractive index layer, a band in which the reflectance is 99.5% or more can be obtained. The reason of this is that because the reflectance of the dielectric DBR is sufficiently high, a small change in the reflectance of the semiconductor DBR does not have a large influence on the reflectance of the whole.

On the other hand, the two differ in the width of the reflection band. The reflection band when the incident-side outermost layer is a high refractive index layer is 98.3 nm, whereas the reflection band when the incident-side outermost layer is a low refractive index layer is 107.7 nm. When the incident-side outermost layer is a low refractive index layer, the reflection band is wider. Therefore, the incident-side outermost layer of a beam portion formed of a semiconductor DBR is preferably a low refractive index layer, unlike in the case where a semiconductor DBR alone is used as a reflector.

In a wavelength-tunable MEMS-VCSEL structure, the longer the resonator length, the lower the wavelength tuning efficiency, or the narrower the longitudinal mode spacing. The wavelength tuning efficiency means the quotient value of the amount of change in the laser oscillation wavelength divided by the amount of change in the air gap length in a MEMS-VCSEL structure. If this value is small, a reflector needs to be moved more largely to cause the same wavelength change. This causes failures such as an increase in MEMS driving voltage and occurrence of pull-in. The longitudinal mode spacing means the value of wavelength spacing from a longitudinal mode the order of which differs by one. If this value is small, a longitudinal mode hop and multimode oscillation are prone to occur. A small longitudinal mode spacing is unfavorable when aiming for a wide band wavelength sweep in a single mode. From the viewpoint of eliminating these adverse effects, a configuration to which the present invention is applied has advantages.

Figure 5A:
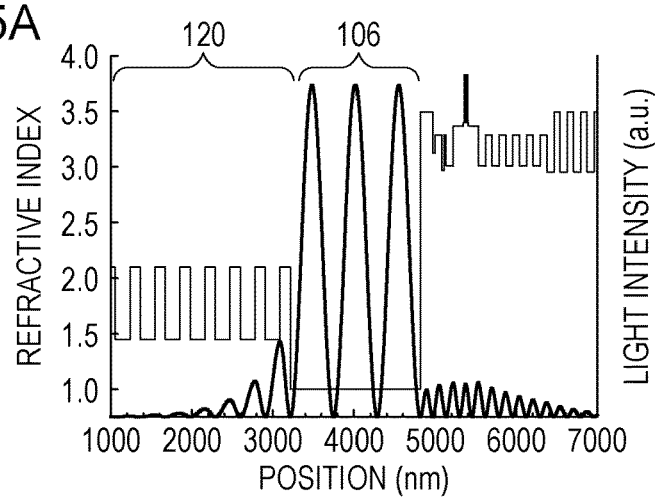
FIG. 5A shows the refractive index distribution and the light intensity distribution in a MEMS-VCSEL of Comparative Example 2.
Figure 5B:
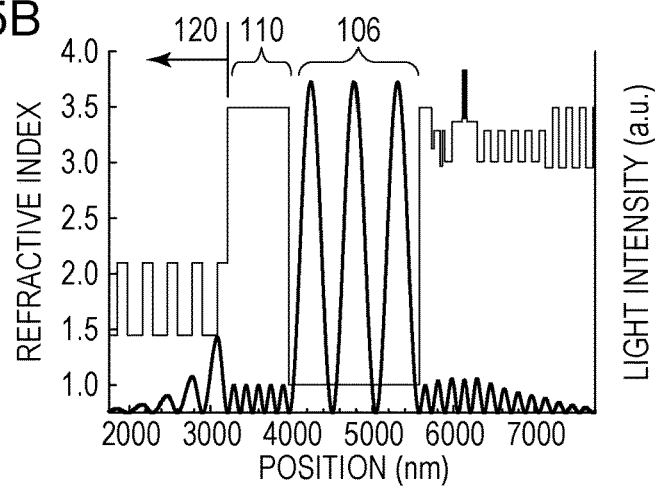
FIG. 5B shows the refractive index distribution and the light intensity distribution in a MEMS-VCSEL of Comparative Example 1.
Figure 5C:
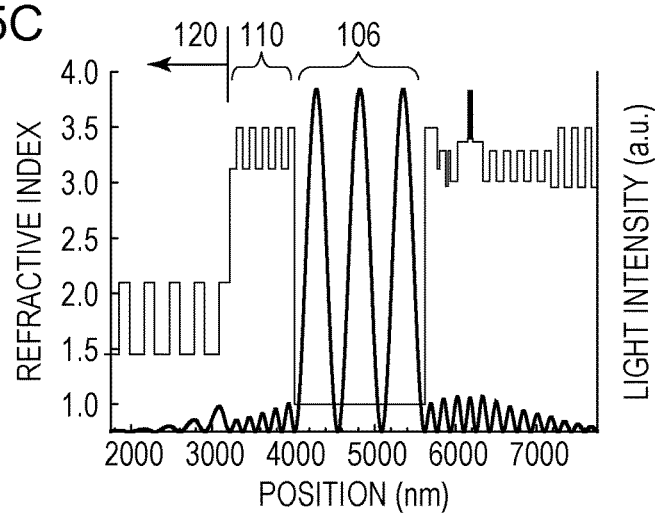
FIG. 5C shows the refractive index distribution and the light intensity distribution in a MEMS-VCSEL of the first embodiment of the present invention.

FIGS. 5A to 5C each show an example of calculation result of the refractive index distribution of a MEMS-VCSEL structure and the light intensity distribution therein. The refractive index distribution is shown by thin solid line, and the light intensity distribution is shown by thick solid line. FIG. 5A shows the calculation result of the refractive index distribution and the light intensity distribution of a MEMS-VCSEL structure that employs a movable portion formed of a second reflector alone, corresponding to the above-described Comparative Example 2. FIG. 5B shows the calculation result of the refractive index distribution and the light intensity distribution of a MEMS-VCSEL structure that employs a movable portion in which a beam portion formed of a single layer of semiconductor and a second reflector are stacked, corresponding to the above-described Comparative Example 1. FIG. 5C shows the calculation result of the refractive index distribution and the light intensity distribution of a MEMS-VCSEL structure that employs a movable portion in which a beam portion 110 formed of a semiconductor DBR and a second reflector 120 are stacked, to which the present invention is applied. Of each of FIGS. 5A to 5C, the left-hand side corresponds to the top side of the MEMS-VCSEL, and the right-hand side corresponds to the bottom side of the MEMS-VCSEL. Not the whole second reflector is shown.

The calculation results shown in FIG. 5A and FIG. 5B will be compared. The difference in structure between the two is whether or not a beam portion is provided on the bottom side of a dielectric DBR. Owing to this difference, the structure shown in FIG. 5B has an actual resonator length longer than that of the structure shown in FIG. 5A by the length of the beam portion. As shown in FIG. 5B, the peak of light intensity distribution located at the interface between the second reflector and the air gap of FIG. 5A shifts as it is to the interface between the second reflector and the beam portion. As shown in FIG. 5B, attenuation of light intensity does not arise in the beam portion, and attenuation of light intensity arises in the second reflector. It can be seen that, for this reason, the effective resonator length is also longer that of the structure shown in FIG. 5A.

As with the structure shown in FIG. 5B, the structure shown in FIG. 5C, to which the present invention is applied, has an actual resonator length longer than that of the structure shown in FIG. 5A. However, attenuation of light intensity arises in the beam portion 110, and the peak at the interface between the second reflector 120 and the beam portion 110 is sufficiently small. As a result, the effective resonator length is short.

Figure 6A:
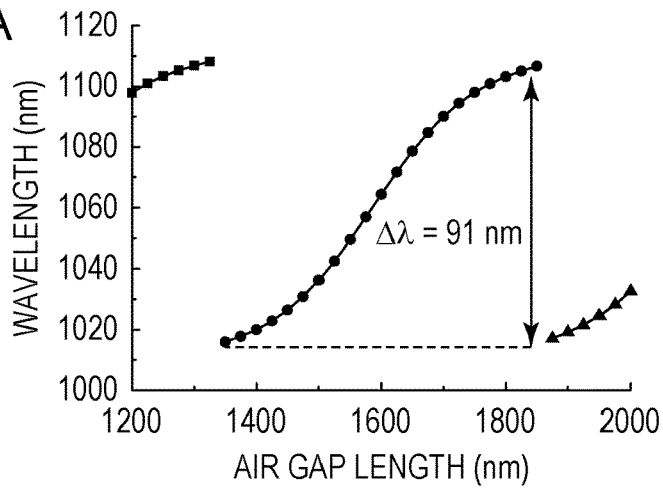
FIG. 6A shows the wavelength tunability characteristic of the MEMS-VCSEL of Comparative Example 2.
Figure 6B:
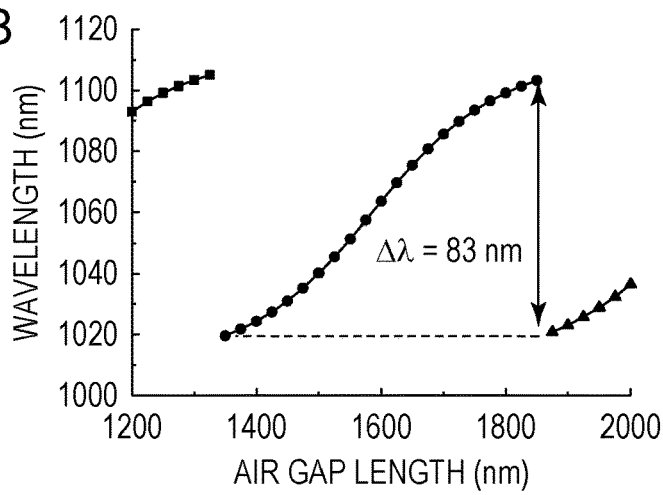
FIG. 6B shows the wavelength tunability characteristic of the MEMS-VCSEL of Comparative Example 1.
Figure 6C:
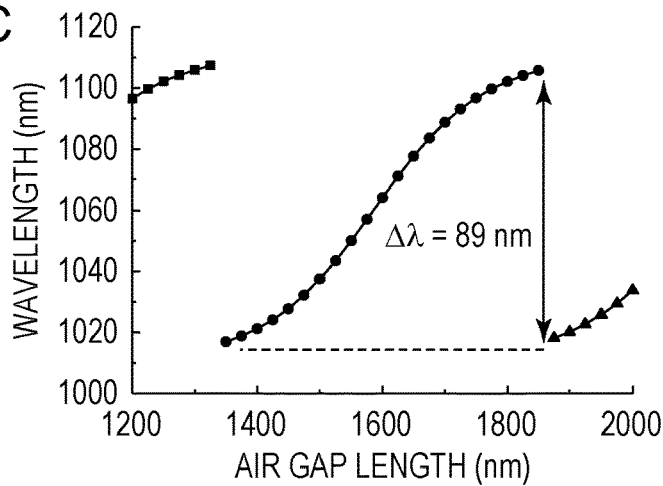
FIG. 6C shows the wavelength tunability characteristic of the MEMS-VCSEL of the first embodiment of the present invention.

The calculation result of the relationship between the laser oscillation wavelength and the air gap length of each of the MEMS-VCSELs shown in FIG. 5A to 5C is shown in FIG. 6A to 6C. In a MEMS-VCSEL, the laser oscillation wavelength changes depending on the change in air gap length. In general, a plurality of longitudinal modes exist, and therefore a plurality of laser oscillation wavelengths can exist for the same air gap length. Here, calculation was performed on the assumption that the longitudinal mode closest to 1060 nm oscillates laser. A wavelength range such that a longitudinal mode that oscillates laser near the wavelength of 1060 nm near the air gap length of 1600 nm does not mode hop to a longitudinal mode of another order, will be referred to as longitudinal mode spacing.

FIGS. 6A, 6B, and 6C respectively correspond to the calculation results of the structures shown in FIGS. 5A, 5B, and 5C. As can be read from FIGS. 6A, 6B, and 6C, the slope of graph (corresponding to wavelength tuning efficiency) near the wavelength of 1060 nm varies depending on the structure. Accordingly, the longitudinal mode spacing Δλ also varies. Δλ is the difference between the maximum wavelength and the minimum wavelength when sweeping is performed in a longitudinal mode that oscillates laser near the wavelength of 1060 nm. Δλ in FIGS. 6A, 6B, and 6C are respectively 91 nm, 83 nm, and 89 nm.

The configuration to which the present invention is applied, which corresponds to FIG. 6C, has a longitudinal mode spacing that is slightly narrow compared to FIG. 6A corresponding to Comparative Example 2 and is slightly wide compared to FIG. 6B corresponding to Comparative Example 1. That is, by using the present invention, simplicity of manufacturing process and a wide longitudinal mode spacing can both be achieved.

Figure 7:
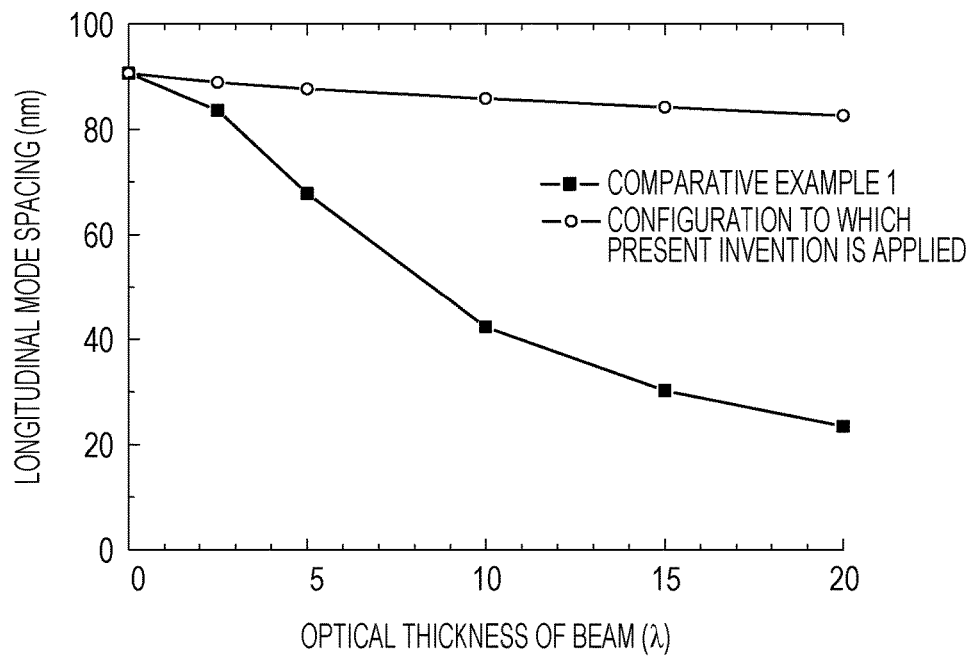
FIG. 7 shows the relationship between the longitudinal mode spacing and the thickness of the beam portion of the MEMS-VCSEL of the first embodiment of the present invention and the MEMS-VCSEL of Comparative Example 1.

FIG. 7 shows the relationship between the longitudinal mode spacing and the optical thickness of the beam portion in MEMS-VCSELs. The horizontal axis shows the optical thickness of the beam portion in units of λ, where λ is a wavelength of 1060 nm. In the above-described structure of Comparative Example 1, the longitudinal mode spacing decreases significantly with increasing optical thickness of the beam portion. In the configuration to which the present invention is applied, the longitudinal mode spacing decreases as the optical thickness of the beam portion increases, but the degree of decrease is gradual compared to Comparative Example 1. In particular, when the optical thickness of the beam portion is about to exceed 3.0λ, in Comparative Example 1, the longitudinal mode spacing starts to decrease steeply. Therefore, when the optical thickness of the beam portion is 3.0λ or more, the application of the present invention is effective.

Second Reflector

The second reflector is formed of a DBR in which high refractive index layers formed of dielectric material and low refractive index layers formed of dielectric material are alternately stacked, and each layer has an optical thickness of ¼ wavelength. The high refractive index layers of the DBR can be formed of titanium oxide or tantalum pentoxide, and the low refractive index layers of the DBR can be made of silicon oxide. The number of layers and the number of pairs of the DBR can be appropriately set as long as the desired reflection band can be obtained. The optical thickness of each layer forming the DBR is preferably, but not necessarily, an odd multiple of λ/4, where λ is the center wavelength of the wavelength band having a reflectance of 99.5% or more in the reflectance spectrum of the second reflector. In consideration, for example, of variation in deposition, the optical thicknesses of high refractive index layers and low refractive index layers of the DBR only have to satisfy the following expressions. If the DBR satisfies Expressions 1 and 2, a high reflectance characteristic can be obtained.

$(\lambda/4)\times(2n+3/4)$ less than or equal to t1 less than or equal to $(\lambda/4)\times(2n+5/4)$    Expression 1, and $(\lambda/4)\times(2m+3/4)$ less than or equal to t2 less than or equal to $(\lambda/4)\times(2m+5/4)$    Expression 2, where t1 and t2 are respectively the optical thicknesses of high refractive index layers and low refractive index layers of the second reflector, and n and m are each an integer equal to or greater than zero.

Beam Portion

The beam portion has a DBR in which high refractive index layers formed of semiconductor and low refractive index layers formed of semiconductor are alternately stacked, and each layer has an optical thickness of ¼ wavelength. Examples of pairs of high refractive index layer and low refractive index layer include $Al_{0.4}Ga_{0.6}As$ and $Al_{0.9}Ga_{0.1}As$, and GaAs and $Al_{0.9}Ga_{0.1}As$. The number of layers and the number of pairs of the DBR can be appropriately set as long as the desired reflection band can be obtained. The optical thickness of each layer forming the DBR is preferably, but not necessarily, an odd multiple of λ/4, where λ is the center wavelength of the wavelength band having a reflectance of 99.5% or more in the reflectance spectrum of the second reflector. In consideration, for example, of variation in deposition, the optical thicknesses of high refractive index layers and low refractive index layers of the DBR only have to satisfy the following expressions. If the DBR satisfies Expressions 3 and 4, a high reflectance characteristic can be obtained.

$(\lambda/4)\times(2k+3/4)$ less than or equal to t3 less than or equal to $(\lambda/4)\times(2k+5/4)$    Expression 3 and $(\lambda/4)\times(2l+3/4)$ less than or equal to t4 less than or equal to $(\lambda/4)\times(2l+5/4)$    Expression 4, where t3 and t4 are respectively the optical thicknesses of high refractive index layers and low refractive index layers of the DBR of the beam portion, and k and l are each an integer equal to or greater than zero.

The beam portion may be supported at a point by the support layer 105 as shown in FIG. 1A, or may be supported at a plurality of points. A structure for relaxing, for example, the strain during crystal growth, and the stress resulting from operating environmental temperature, may be formed in the beam portion.

The beam portion is not particularly limited as long as it can change the resonator length. For example, the beam portion may be driven by electrostatic force as in this embodiment, or may be mechanically driven using piezoelectric material.

First Reflector

The first reflector is formed, for example, of a DBR in which high refractive index layers and low refractive index layers are alternately stacked, and each layer has an optical thickness of ¼ wavelength. In order to widen the wavelength tunable range, the first reflector preferably has high reflectance in as wide a band as possible. Both a DBR made of semiconductor and a DBR made of dielectric material can be used. In general, the refractive index difference between layers of high refractive index and layers of low refractive index of a DBR formed of dielectric material can be increased more easily than that of a DBR formed of semiconductor. Therefore, a DBR formed of dielectric material can achieve high reflectance with a small number of stacked layers. As for a DBR formed of semiconductor, although the number of pairs is large, it has advantages in manufacturing. For example, a semiconductor DBR can be formed by crystal growth together with an active layer and others at the same time, and can be made conductive by doping.

If the first reflector is a semiconductor DBR, the same material constitution as that of beam portion can be used, or a pair of GaAs and AlAs can be used. If the first reflector is a dielectric DBR, the same material constitution as that of the second reflector can be used.

A high index contrast subwavelength grating (hereinafter referred to as an HCG) may be used as the first reflector. The HCG has a configuration in which a material of high refractive index and a material of low refractive index are alternately and periodically arranged in the in-plane direction. Examples of HCG include a periodic structure of high refractive index regions (AlGaAs parts) and low refractive index regions (gap parts) formed by processing a semiconductor layer such as an AlGaAs layer to provide periodic gaps.

Active Layer

The material of the active layer is not particularly limited as long as the material generates light by current injection or absorption of light. When causing the active layer to emit light in a wavelength band near 850 nm, a material having a quantum well structure formed of $Al_nGa_{1-n}As$ (0 less than or equal to n less than or equal to 1) can be used. When causing the active layer to emit light in a wavelength band near 1060 nm, a material formed of $In_nGa_{1-n}As$ (0 less than or equal to n less than or equal to 1) can be used.

The active layer preferably has a sufficiently wide gain. Specifically, the active layer preferably has a gain in a wavelength width wider than the reflection bands of the first reflector and the second reflector. Examples of such an active layer include an active layer having a quantum well structure capable of light emission at at least two different energy levels, a so-called asymmetric quantum well structure. The quantum well structure may be formed of a plurality of layers so as to have a single quantum well or a multiple quantum well. The material and structure of the active layer in this embodiment can be appropriately selected according to the wavelength desired to be oscillated.

Examples of configurations exciting the active layer include a current injection type using electrodes such as that shown in FIG. 1A, and photoexcitation using an external light source. The present invention can use both configurations. In the case of the current injection type, a current constriction layer may be used. Specifically, a method may be used in which part of the lower spacer layer or the upper spacer layer is selectively oxidized by a selective oxidation process. The oxidized region becomes a high resistance part, and the unoxidized region becomes a low resistance part. Current flows through the unoxidized region to the active layer. Therefore, the light emitting region in the active layer is defined.

Air Gap

Normally, no solid exists in the air gap. Therefore, depending on the atmosphere, the air gap may be vacuum, or a fluid such as air or inert gas, or a liquid such as water may exist therein. The length of the air gap in the thickness direction of the structure can be determined in consideration of the wavelength tunable band width and the pull-in of the movable reflector. For example, when the air gap is filled with air and the wavelength is tuned within a wavelength tunable band width of 100 nm centering around 1060 nm, the length of the air gap is about 2 μm.

First Electrode, Second Electrode, and Third Electrode

The first electrode, the second electrode, and the third electrode can be formed of a simple metal, such as titanium or gold, an alloy, or a lamination of metal films. For example, Ti/Au or AuGe/Ni/Au can be used as electrode material. The first electrode may be disposed not on the bottom side but on the top side of the first reflector as long as carriers can be injected into it. When electrostatic attractive force is caused to act between the beam portion and the third electrode to drive the beam portion, the second electrode may be disposed not in the support region of the beam portion but in the movable part. When the active layer is excited by photoexcitation, the first electrode is not necessary.

Second Embodiment

In this embodiment, a description will be given of an example of an information obtaining apparatus that employs the surface emitting laser of the first embodiment as a light source device. A wavelength-tunable light source device can be used as a light source for optical communication or a light source for optical measurement. A wavelength-tunable light source device can also be used as a light source of an information obtaining apparatus that obtains information of the inside of a measuring object in a non-destructive manner. As an example of an information obtaining apparatus that employs the light source device of this embodiment, an optical coherence tomography apparatus (hereinafter referred to as an OCT apparatus) will be described with reference to FIG. 8.

Figure 8:
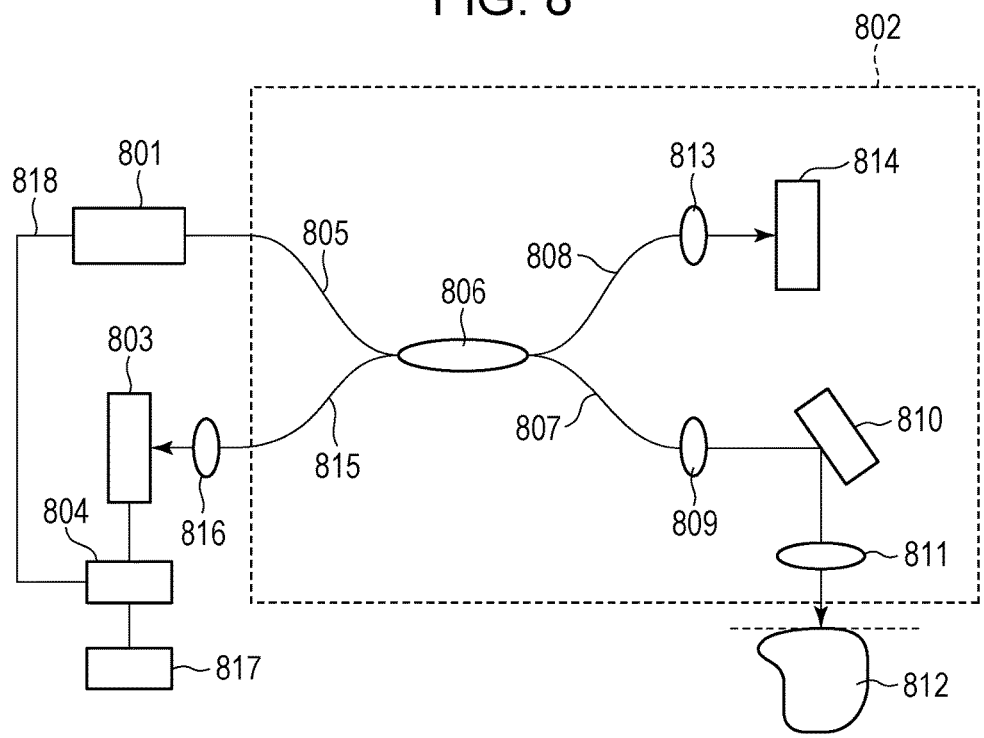
FIG. 8 is a schematic diagram showing an example of an imaging apparatus according to a second embodiment of the present invention.

FIG. 8 is a schematic diagram showing an OCT apparatus according to this embodiment. The OCT apparatus at least has a light source device 801, an interference optical system 802, a light detecting unit 803, and an information obtaining unit 804 that obtains internal information of a measuring object. The surface emitting laser of the first or second embodiment can be used as the light source device 801. Although not shown, the information obtaining unit 804 has a Fourier transformer. The form in which the information obtaining unit 804 has a Fourier transformer is not particularly limited as long as the information obtaining unit 804 has a function of Fourier-transforming input data. An example is a case where the information obtaining unit 804 has a calculating unit, and this calculating unit has a function of Fourier transformation. Specifically, the calculating unit is a computer having a CPU, and this computer executes an application having a Fourier transformation function. Another example is a case where the information obtaining unit 804 has a Fourier transformation circuit having a Fourier transformation function.

Light emitted from the light source device 801 passes through the interference optical system 802, becomes interfering light having information of a measuring object 812, and is output. The interfering light is received by the light detecting unit 803. The light detecting unit 803 may be of a differential detection type or a simple intensity monitor type. The information of the time waveform of the intensity of the received interfering light is sent from the light detecting unit 803 to the information obtaining unit 804. The information obtaining unit 804 obtains the peak value of the time waveform of the intensity of the received interfering light, and performs Fourier transform to obtain information of the object 812 (for example, tomographic image information). Components other than the light source device 801, interference optical system 802, light detecting unit 803, and information obtaining unit 804 described here may also be provided optionally.

The process from the emission of light from the light source device 801 to the obtaining of information of the inside of the measuring object will be described in detail below. Light emitted from the light source device 801 passes through an optical fiber 805, enters a coupler 806, and is divided into irradiation light that passes through an irradiation light fiber 807 and reference light that passes through a reference light fiber 808. The coupler 806 is a single mode coupler at the wavelength band of the light source. Various types of fiber couplers may be configured using 3 dB couplers. The irradiation light passes through a collimator 809 to become parallel light, and is reflected by a mirror 810.

The light reflected by the mirror 810 passes through a lens 811, is shed on the object 812, and is reflected from each layer in the depth direction of the object 812.

On the other hand, the reference light passes through a collimator 813 and is reflected by a mirror 814. Interfering light between the reflected light from the object 812 and the reflected light from the mirror 814 is generated in the coupler 806. The interfering light passes through a fiber 815, is collected through a collimator 816, and is received by the light detecting unit 803. Information of the intensity of the interfering light received by the light detecting unit 803 is converted into electrical information such as voltage, and is sent to the information obtaining unit 804. The information obtaining unit 804 processes, more specifically, Fourier-transforms the data of the intensity of the interfering light, to obtain tomographic image information. The data of the intensity of the interfering light to be Fourier-transformed is normally data sampled at equal wavenumber intervals, but data sampled at equal wavelength intervals may be used.

The obtained tomographic image information may be sent from the information obtaining unit 804 to an image display unit 817 and displayed as an image. A three-dimensional tomographic image of the measuring object 812 can be obtained by scanning the mirror 810 in a plane perpendicular to the direction in which the irradiation light is incident. The light source device 801 may be controlled by the information obtaining unit 804 through an electric circuit 818. Although not shown in the figure, the intensity of light emitted from the light source device 801 may be monitored successively, and the data thereof may be used for amplitude correction of the interfering light intensity signal.

The OCT apparatus is useful when obtaining a tomographic image in a living body such as an animal or a human in the fields of ophthalmology, dentistry, dermatology, and the like. Information on a tomographic image of a living body includes not only a tomographic image of a living body but also numerical data necessary to obtain a tomographic image. In particular, the OCT apparatus is suitable for use to obtain information on tomographic images of ocular fundi, teeth, and blood vessels of a human body.

Other Embodiments

The surface emitting laser of the first embodiment can be used not only as a light source of the above-described OCT apparatus but also as a light source for optical communication or a light source for optical measurement. A plurality of VCSEL structures to which the first embodiment is applied may be arrayed on the same plane and may be used as an array light source.

EXAMPLES

Examples of the present invention will be described below. The present invention is not limited to the configurations of examples described below. For example, the type and composition of material, the shape, and the size can be appropriately changed within the range of the present invention.

Although the laser oscillation wavelength is near 1060 nm in the following examples, oscillation at any wavelength can be performed by selecting appropriate material and structure.

Example 1

FIG. 1A is a sectional schematic view showing the layer structure of a VCSEL of this example. The MEMS-VCSEL of this example is formed of a GaAs-based compound semiconductor and is designed so as to be capable of wavelength sweep near 1060 nm.

A first reflector 101 formed of a semiconductor DBR in which 5 pairs of $Al_{0.4}Ga_{0.6}As$ layers and $Al_{0.9}Ga_{0.1}As$ layers are alternately stacked on 30 pairs of GaAs layers and AlAs layers stacked alternately, is disposed on a GaAs substrate 100. A lower spacer layer 102 formed of $Al_{0.25}Ga_{0.75}As$, and an active layer 103 formed of a 3 period multiple quantum well structure consisting of quantum well layers formed of GaInAs and barrier layers formed of GaAsP, are disposed on the first reflector 101. An upper spacer layer 104 formed of $Al_{0.25}Ga_{0.75}As$ is disposed on the active layer 103. A beam portion 110 is disposed thereon with a support layer 105 formed of GaAs interposed therebetween. A second reflector 120 is disposed on the beam portion 110.

The beam portion 110 is formed of a semiconductor DBR in which 5 pairs of high refractive index layers 111 and low refractive index layers 112 are alternately stacked. The high refractive index layers 111 are formed of GaAs, and the low refractive index layers 112 are formed of $Al_{0.7}Ga_{0.3}As$. The second reflector 120 is formed of a dielectric DBR in which 10.5 pairs of high refractive index layers 121 and low refractive index layers 122 are alternately stacked. The high refractive index layers 121 are formed of $Ta_2O_5$, and the low refractive index layers 122 are formed of $SiO_2$. The optical thickness of the high refractive index layers 111, the low refractive index layers 112, the high refractive index layers 121, and the low refractive index layers 122 is designed so as to be $\lambda/4$, where $\lambda$ is a wavelength of 1060 nm.

Thus, a movable portion in which the beam portion 110 and the second reflector 120 are stacked, and the first reflector 101 are provided in opposed relationship with the active layer 103 therebetween and form a laser oscillator. An air gap 106 is formed between the beam portion 110 and the upper spacer layer 104. The air gap 106 is filled with air, and the length of the air gap 106 (air gap length) is variable near 1600 nm.

A first electrode 107 is disposed on the bottom surface of the substrate 100, a second electrode 108 is disposed on the top surface of the beam portion 110, and a third electrode 109 is disposed on the top surface of the upper spacer layer 104. By applying a voltage between the first electrode 107 and the third electrode 109, carriers are injected into the active layer 103, and the active layer 103 emits light. By applying a voltage between the second electrode 108 and the third electrode 109, the position of the beam portion 110 can be changed in the vertical direction with electrostatic force. The resonator length can thereby be changed, that is, the laser oscillation wavelength can be changed.

Figure 9A:
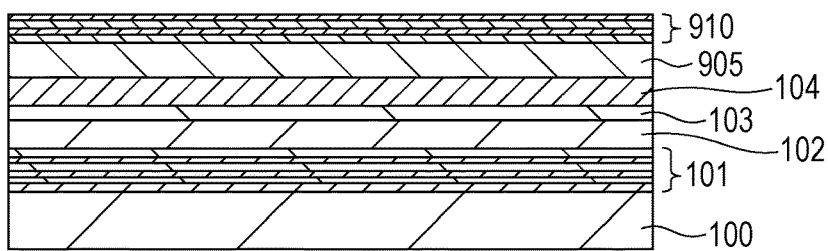
FIG. 9A is a schematic diagram showing an example of a method for manufacturing the wavelength-tunable surface emitting laser according to the first embodiment.

A manufacturing method of this example will be described with reference to FIG. 9. First, as shown in FIG. 9A, a semiconductor multilayer film is formed by epitaxial growth on a GaAs substrate 100. The semiconductor multilayer film consists of a first reflector 101 having the above-described configuration, a lower spacer layer 102 having the above-described configuration, an active layer 103 having the above-described configuration, an upper spacer layer 104 having the above-described configuration, a sacrifice layer 905 formed of $Al_{0.53}In_{0.47}P$, and a beam portion precursor layer 910, which are formed on the substrate 100. The beam portion precursor layer 910 is formed of a semiconductor DBR in which 5 pairs of high refractive index layers formed of GaAs and low refractive index layers formed of $Al_{0.7}Ga_{0.3}As$ are alternately stacked. The thickness of the sacrifice layer 905 is 1900 nm.

Figure 9B:
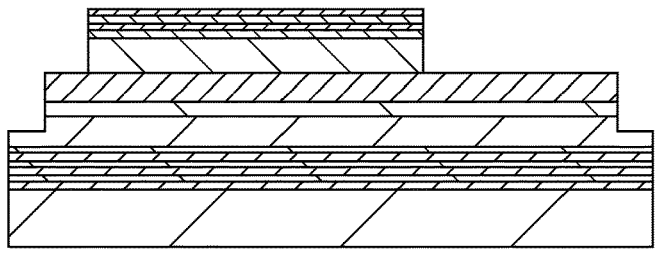
FIG. 9B is a schematic diagram showing an example of a method for manufacturing the wavelength-tunable surface emitting laser according to the first embodiment.

Next, as shown in FIG. 9B, photolithography and dry etching are repeated to form a mesa structure and a pattern of a beam portion region.

Figure 9C:
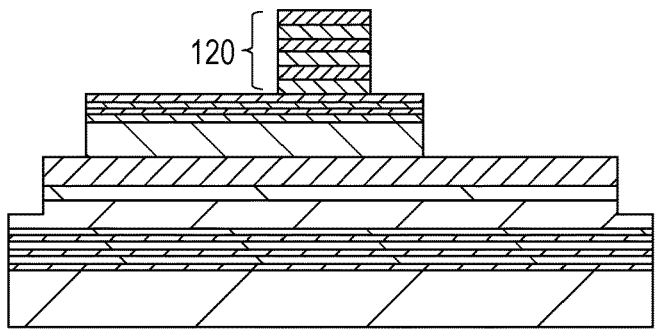
FIG. 9C is a schematic diagram showing an example of a method for manufacturing the wavelength-tunable surface emitting laser according to the first embodiment.
Figure 9D:
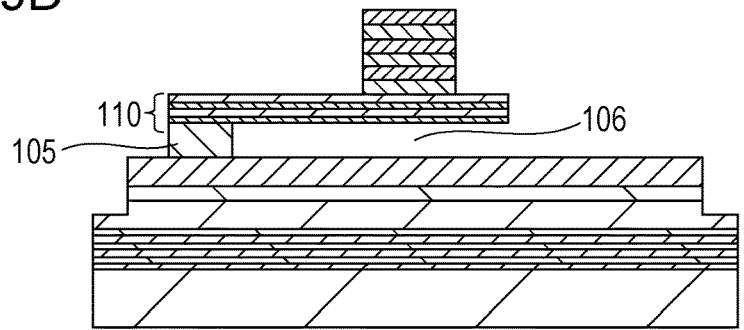
FIG. 9D is a schematic diagram showing an example of a method for manufacturing the wavelength-tunable surface emitting laser according to the first embodiment.

Next, as shown in FIG. 9C, a dielectric DBR is formed by ion beam assisted deposition on the pattern of a beam portion. Next, the dielectric DBR is patterned by photolithography and dry etching to form a second reflector 120. The dielectric DBR has a configuration in which 10.5 pairs of high refractive index layers formed of $Ta_2O_5$ and low refractive index layers formed of $SiO_2$ are alternately stacked.

Finally, part of the sacrifice layer 905 is removed by wet etching to form a beam portion 110, a support layer 105, and an air gap 106. For this, selective etching between AlGaAs-based material and AlInP-based material needs to be performed. By using hydrochloric acid as etchant, selective etching can be performed. In this example, hydrochloric acid of 37 wt % diluted three times with water can be used as etchant. By removing only the sacrifice layer 905 of $Al_{0.53}In_{0.47}P$ with this etchant, the air gap 106 can be formed. A part desired to be left as the support layer 105 may be covered by patterning photoresist or the like.

The movable portion of the MEMS-VCSEL shown in this example, which is a stack of the beam portion 110 and the second reflector 120 has a reflection band of 146 nm, which is the same as the reflection band of the movable portion of the MEMS-VCSEL in which the whole beam portion is a semiconductor DBR shown in FIG. 2A. The longitudinal mode spacing near the wavelength of 1060 nm of the MEMS-VCSEL structure shown in this example was 89 nm as shown in FIG. 6C. On the other hand, when the beam portion is formed of a GaAs single layer having an optical thickness of 2.5λ, the reflection band was 110 nm as shown as Comparative Example 1 of FIG. 2A, and the longitudinal mode spacing was 83 nm as shown in FIG. 6B. Thus, a MEMS-VCSEL that employs a reflector having a configuration to which the present invention is applied, can have optical characteristics suitable for wavelength sweep over a wider band than those of conventional ones.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-093535, filed Apr. 30, 2015, which is hereby incorporated by reference herein in its entirety.

REFERENCE SIGNS LIST

101 First reflector
103 Active layer
106 Air gap
110 Beam portion
120 Second reflector

The invention claimed is:

1. A wavelength-tunable surface emitting laser comprising:
a first reflector;
an active layer disposed on the first reflector;
a beam portion disposed over the active layer with an air gap therebetween; and
a second reflector disposed on the beam portion,
wherein the second reflector has a distributed Bragg reflector consisting of a stack of dielectric layers,
wherein the beam portion has a distributed Bragg reflector consisting of a stack of conductive semiconductor layers,
wherein the distributed Bragg reflector of the beam portion has a configuration in which third layers and fourth layers having a refractive index lower than that of the third layers are alternately stacked, and
wherein the semiconductor layer closest to the active layer in the distributed Bragg reflector of the beam portion is the fourth layer.

2. The surface emitting laser according to claim 1, wherein the optical thickness of the beam portion is greater than or equal to the center wavelength of a wavelength band having a reflectance of 99.5% or more in the reflectance spectrum of the second reflector.

3. The surface emitting laser according to claim 1, wherein the distributed Bragg reflector of the second reflector has a configuration in which first layers and second layers having a refractive index lower than that of the first layers are alternately stacked.

4. The surface emitting laser according to claim 3, wherein when the center wavelength of a wavelength band having a reflectance of 99.5% or more in the reflectance spectrum of the second reflector is denoted by λ, and the optical thicknesses of the first layers and the second layers of the distributed Bragg reflector of the second reflector are respectively denoted by t1 and t2, the following expressions are satisfied:

$$(\lambda/4) \times (2n+3/4) \text{ less than or equal to } t1 \text{ less than or equal to } (\lambda/4) \times (2n+5/4),$$

and $$(\lambda/4) \times (2m+3/4) \text{ less than or equal to } t2 \text{ less than or equal to } (\lambda/4) \times (2m+5/4),$$

where n and m are each an integer greater than or equal to zero.

5. The surface emitting laser according to claim 1, wherein when the center wavelength of a wavelength band having a reflectance of 99.5% or more in the reflectance spectrum of the second reflector is denoted by λ, and the optical thicknesses of the third layers and the fourth layers of the distributed Bragg reflector of the beam portion are respectively denoted by t3 and t4, the following expressions are satisfied:

$$(\lambda/4) \times (2k+3/4) \text{ less than or equal to } t3 \text{ less than or equal to } (\lambda/4) \times (2k+5/4),$$

and $$(\lambda/4) \times (2l+3/4) \text{ less than or equal to } t4 \text{ less than or equal to } (\lambda/4) \times (2l+5/4),$$

where k and l are each an integer greater than or equal to zero.

6. A wavelength-tunable surface emitting laser comprising:
a first reflector;
an active layer disposed on the first reflector;
a beam portion disposed over the active layer with an air gap therebetween; and
a second reflector disposed on the beam portion,
wherein the second reflector has a distributed Bragg reflector consisting of a stack of dielectric layers,
wherein the beam portion has a plurality of reflecting surfaces therein,
wherein the beam portion is configured to causes a part of light emitted from the active layer to be reflected by a reflecting surface at the interface between the beam portion and the air gap, a reflecting surface at the interface between the beam portion and the second reflector, and the plurality of reflecting surfaces in the beam portion, and to cause light rays reflected by the reflecting surfaces of the beam portion to interfere with each other so as to weaken the interference effect due to the reflecting surface at the interface between the beam portion and the air gap and the reflecting surface at the interface between the beam portion and the second reflector,
wherein the beam portion has a configuration in which third layers and fourth layers having a refractive index lower than that of the third layers are alternately stacked, and
wherein the semiconductor layer closest to the active layer in the distributed Bragg reflector of the beam portion is the fourth layer.

7. A wavelength-tunable surface emitting laser comprising:
a first reflector;
an active layer disposed on the first reflector;
a beam portion disposed over the active layer with an air gap therebetween; and
a second reflector disposed on the beam portion,
wherein the second reflector has a distributed Bragg reflector consisting of a stack of dielectric layers,
wherein the beam portion is formed of a multilayer film such that a wavelength band having a reflectance of 99.5% or more in the reflectance spectrum of the second reflector is wider than that in the case where the beam portion is formed of a single layer,
wherein the beam portion has a configuration in which third layers and fourth layers having a refractive index lower than that of the third layers are alternately stacked, and
wherein the semiconductor layer closest to the active layer in the distributed Bragg reflector of the beam portion is the fourth layer.

8. The surface emitting laser according to claim 6, wherein the optical thickness of the beam portion is greater than or equal to the center wavelength of a wavelength band having a reflectance of 99.5% or more in the reflectance spectrum of the second reflector.

9. The surface emitting laser according to claim 6, wherein the distributed Bragg reflector of the second reflector has a configuration in which first layers and second layers having a refractive index lower than that of the first layers are alternately stacked.

10. The surface emitting laser according to claim 9, wherein when the center wavelength of a wavelength band having a reflectance of 99.5% or more in the reflectance spectrum of the second reflector is denoted by $\lambda$, and the optical thicknesses of the first layers and the second layers of the distributed Bragg reflector of the second reflector are respectively denoted by t1 and t2, the following expressions are satisfied:

$(\lambda/4)\times(2n+3/4)$ less than or equal to t1 less than or equal to $(\lambda/4)\times(2n+5/4)$, and $(\lambda/4)\times(2m+3/4)$ less than or equal to t2 less than or equal to $(\lambda/4)\times(2m+5/4)$, where n and m are each an integer greater than or equal to zero.

11. The surface emitting laser according to claim 6, wherein when the center wavelength of a wavelength band having a reflectance of 99.5% or more in the reflectance spectrum of the second reflector is denoted by $\lambda$, and the optical thicknesses of the third layers and the fourth layers of the distributed Bragg reflector of the beam portion are respectively denoted by t3 and t4, the following expressions are satisfied:

$(\lambda/4)\times(2k+3/4)$ less than or equal to t3 less than or equal to $(\lambda/4)\times(2k+5/4)$, and $(\lambda/4)\times(2l+3/4)$ less than or equal to t4 less than or equal to $(\lambda/4)\times(2l+5/4)$, where k and l are each an integer greater than or equal to zero.

12. An information obtaining apparatus comprising:
the surface emitting laser according to claim 1; and
an information obtaining unit that obtains internal information of a measuring object.

13. An imaging apparatus comprising:
the surface emitting laser according to claim 1;
an interference optical system that divides light from the surface emitting laser into irradiation light with which a measuring object is irradiated, and reference light, and generates interfering light between light reflected from the measuring object and the reference light;
a light detecting unit that receives the interfering light; and
an information obtaining unit that obtains information of the measuring object based on a signal from the light detecting unit.

\* \* \* \* \*